United States Patent [19]
Dillard et al.

[11] 4,184,903
[45] Jan. 22, 1980

[54] METHOD OF FABRICATING A PHOTOVOLTAIC MODULE OF A SUBSTANTIALLY TRANSPARENT CONSTRUCTION

[75] Inventors: Alan M. Lovelace, Acting Administrator of the National Aeronautics and Space Administration, with respect to an invention of Paul A. Dillard, Sunnyvale; Walter M. Fritz, Santa Clara; Dan R. Lott, San Jose, all of Calif.

[73] Assignee: The United States of America, represented by the Administrator of the National Aeronautics and Space Administration, Washington, D.C.

[21] Appl. No.: 928,133

[22] Filed: Jul. 26, 1978

[51] Int. Cl.² .................. B32B 31/20; B25B 11/00
[52] U.S. Cl. ................... 156/104; 156/278; 156/285; 156/300; 156/303; 156/312
[58] Field of Search ............... 156/299, 300, 303, 305, 156/295, 312, 285, 104, 278

[56] References Cited
U.S. PATENT DOCUMENTS

| | | | |
|---|---|---|---|
| 3,600,246 | 8/1971 | Breen | 156/299 |
| 3,804,692 | 4/1974 | Sly | 156/300 |
| 3,963,556 | 6/1976 | Patterson et al. | 156/285 X |
| 3,994,760 | 11/1976 | Park | 156/104 |
| 4,132,218 | 1/1979 | Bennett | 156/104 X |

Primary Examiner—Harold Ansher
Attorney, Agent, or Firm—Monte F. Mott; John R. Manning; Wilfred Grifka

[57] ABSTRACT

A method characterized by the steps of positioning a plurality of uniformly dimensioned photovoltaic cells in registered relation with a plurality of openings formed in a planar tool for affording access to the P contact surface of each of the cells, connecting the N contact surface of alternate cells to the P contact surface of the cells interposed therebetween, removing therefrom residue of solder flux, applying to the N contact surfaces of the cells a transparent adhesive, placing a common transparent cover plate in engaged relation with the adhesive, placing a film over the circular openings for hermetically sealing the openings, and establishing a vacuum between the film and the cover plate for thus simultaneously forcing the cells into vacuum bonded relation with the cover plate.

9 Claims, 17 Drawing Figures

METHOD OF FABRICATING A PHOTOVOLTAIC MODULE OF A SUBSTANTIALLY TRANSPARENT CONSTRUCTION

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

BACKGROUND OF THE INVENTION

1. Field of the Invention

The invention generally relates to a method of fabricating photovoltaic modules, and more particularly to a method of fabricating a photovoltaic module substantially transparent to all energy not used by the cell to produce electricity whereby the overall efficiency of the module is enhanced.

2. Description of the Prior Art

The prior art, of course, is replete with devices and techniques employed in the production of solar cells. Most photovoltaic modules have been designed with a view toward reduction in initial costs of materials. This, of course, results in penalties in performance, of efficiency as well as production costs. However, as pointed out in U.S. application Ser. No. 918,869, now abandoned, it is possible to fabricate a photovoltaic module which is substantially transparent to substantially all solar energy not used to produce electricity. Because of such transparency, the temperature of the module is substantially minimized with an attendant increase in the overall efficiency of the module. For example, it has been found that where cell temperature has been reduced because of module transparency, an improvement in electrical output has been experienced.

Additionally, as can be appreciated by those familiar with the fabrication of photovoltaic modules, it is highly desirable to fabricate photovoltaic or solar modules employing techniques which readily can be adapted for a production-line assembly thereof.

It is, therefore, the general purpose of the instant invention to provide an improved method of fabricating an improved photovoltaic module, said method being adaptable for use in production-line assembly operations.

OBJECTS AND SUMMARY OF THE INVENTION

It is, therefore, an object of the instant invention to provide an improved method of fabricating photovoltaic modules.

Another object is to provide a method of fabricating a photovoltaic module including a plurality of photovoltaic cells substantially transparent to all solar energy not used by the cells in the production of photovoltaic electricity.

These and other objects and advantages are achieved through the practice of a method wherein a plurality of uniformly dimensioned photovoltaic cells are positioned relative to a tool, characterized by a plurality of openings disposed in uniform positional relationship for affording access to the P contact of each of the cells, and thereafter vacuum bonding the cells to a transparent cover plate, as will become more readily apparent by reference to the following description and claims in light of the accompanying drawings.

DESCRIPTION OF THE PREFERRED EMBODIMENT

Figure 1:
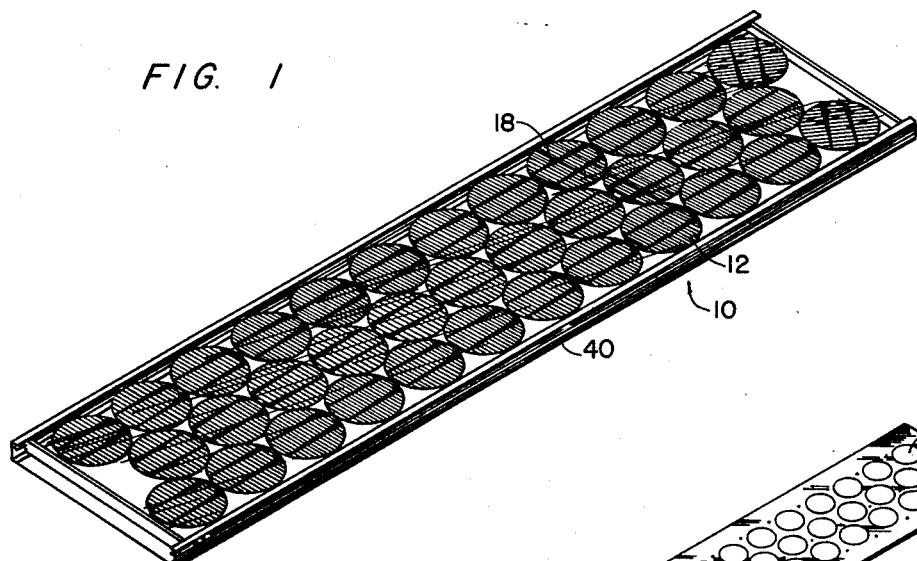
FIG. 1 is a perspective view of a photovoltaic module fabricated employing the method of the instant invention.

Referring now to the drawings with more particularity, wherein like reference characters designate like or corresponding parts throughout the several views, there is shown in FIG. 1 a photovoltaic module, generally designated 10, fabricated in accordance with a method embodying the principles of the instant invention.

As shown in FIG. 1, the module 10 includes a plurality of individual solar cells 12 of circular configurations and of common diameters. The solar cells 12, as shown, comprise N on P cells having an N surface 14, FIG. 13, and a P surface 16, FIG. 14. To the N surface 14 of each of the cells 12 there is connected N contacts 18, of known design, while to the P surface 16 there is connected P contacts 20, FIG. 14. Since photovoltaic cells are well known, a more detailed description thereof is omitted in the interest of brevity.

Figure 2:
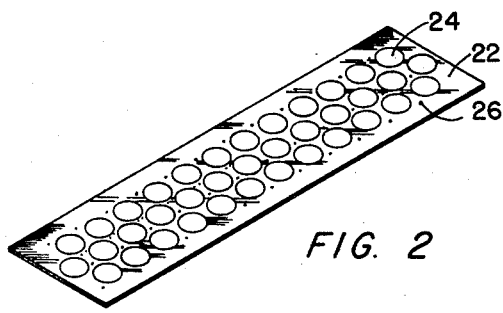
FIG. 2 is a perspective view of a planar tool employed fabricating the module shown in FIG. 1.

In fabricating the module 10, a plurality of solar cells 12 are connected in series. To achieve this, the cells are positioned on the surface of a tool designated 22, FIG. 2. The tool 22 is provided with a plurality of uniformly spaced, circular openings 24 about which there is arranged stop pins 26, of uniform height. The purpose of these pins is to support the solar cells 12 in a registered relationship with the openings 24 and to maintain separation of the cells and adhesive from the cover plate during initial vacuum application, therefore, it will be appreciated that the pins 26 are similarly positioned about each of the openings.

Figure 3:
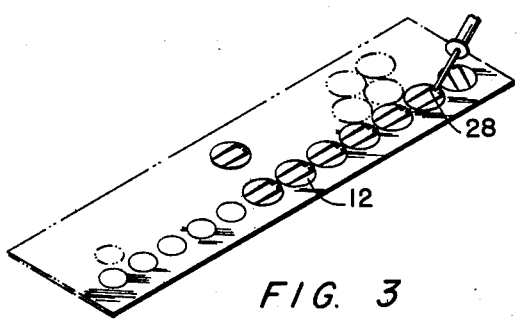
FIGS. 3 through 11 are perspective views illustrating sequential steps performed in a method resulting in the photovoltaic module shown in FIG. 1.
Figure 13:
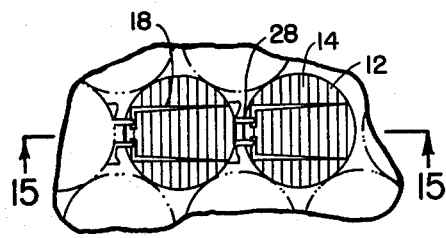
FIG. 13 is a fragmented top plan view of a portion of the partially completed module shown in FIG. 3, but on an enlarged scale.
Figure 14:
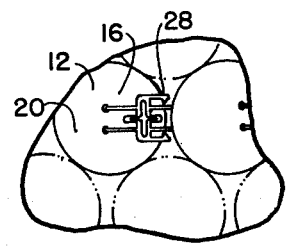
FIG. 14 is a fragmented bottom plan view of a portion of the partially completed module shown in FIG. 6, but also on an enlarged scale.
Figure 15:
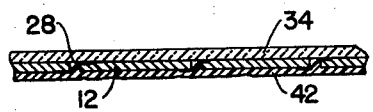
FIG. 15 is a fragmented, cross sectional view of the module in its completed form.

As illustrated in FIG. 3, the solar cells 12 are deposited on the tool 22 in registration with the openings 24, and suitable interconnects 28 are positioned to be soldered to the N contacts 18 as well as to the P contacts 20. The interconnects 28 are now soldered to the N contacts 18 employing a suitable soldering gun 29. The interconnects 28, as best illustrated in FIGS. 13, 14 and 15 are provided to connect the P contact of one cell 12 with the N contact of an adjacent cell 12.

Figure 4:
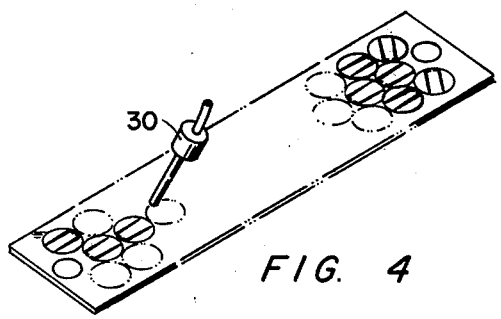
Figure 5:
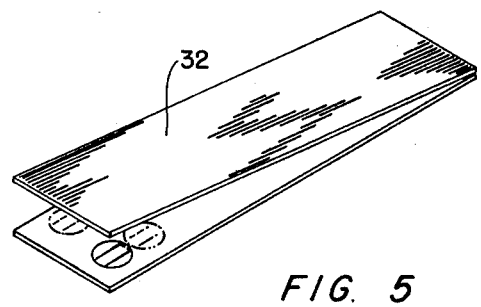
Figure 6:
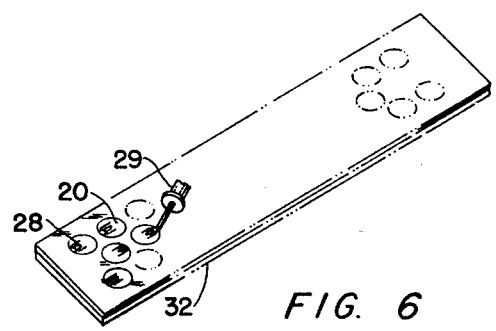
Figure 7:
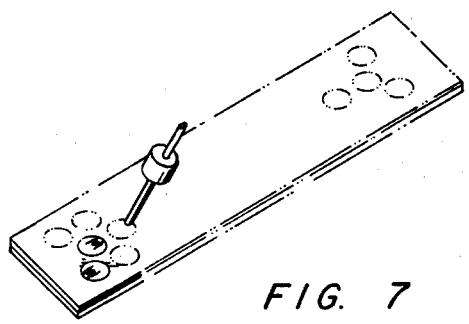
Figure 17:
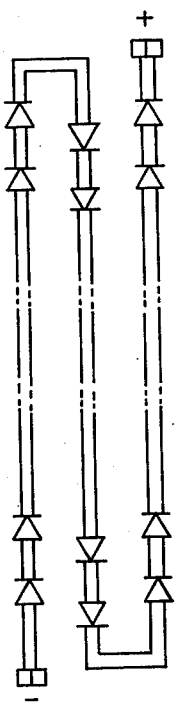
FIG. 17 is a diagrammatic view illustrating a circuit for the module.

Following the soldering of the interconnect 28 to the N contact, as shown in FIG. 4, the solder is removed through the use of a suitable cleaning gun 30. Subsequent to a removal of debris, such as solder flux and the like, a tool cover 32, FIG. 5, comprising a planar member is positioned over the N contact surfaces of the solar cells 12. The cover 32 serves to hold the cells 12 in place for facilitating an inversion of the cells 12, to an orientation as shown in FIG. 6. With the cover 32 in place, soldering of the interconnects 28 to the P contacts 20 of the cells is initiated employing the gun 29. Of course, once the interconnects 28 have been soldered to the P contacts 20 of the solar cells 12, solder flux is removed therefrom employing the cleaning gun 30. It is to be understood that the opposite surface contacts for the cells 12, at the opposite ends of the thus connected array, are provided with leads, not shown, necessary to establish a series circuit as depicted in FIG. 17.

Figure 8:
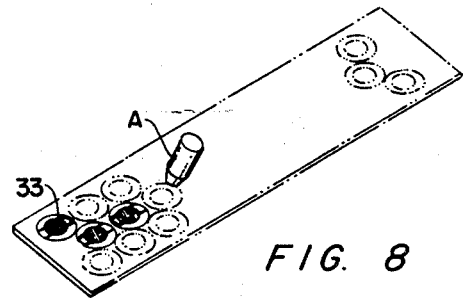
Figure 9:
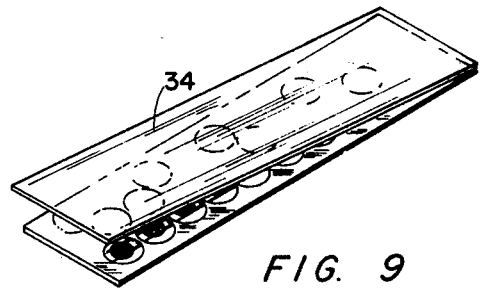

The tool 22 now is inverted for a second time and thereafter the cover 32 is removed. To the N contact surface for each of the solar cells 12 is applied a glob of clear adhesive 33, as illustrated in FIG. 8. A suitable adhesive applicator A is employed for this purpose. Following the deposit of the adhesive on the N surface of the solar cells 12, a glass cover plate 34 is deposited in contiguous relation with the cells, as the cells are supported on the tool 22, as indicated in FIG. 9. The cover plate 34 preferably comprises a sheet of glass highly pervious to solar radiation. Such is obtainable from the Sunadex Corporation under the designation ASG and comprises a low-iron, high transparent glass sheet.

Figure 10:
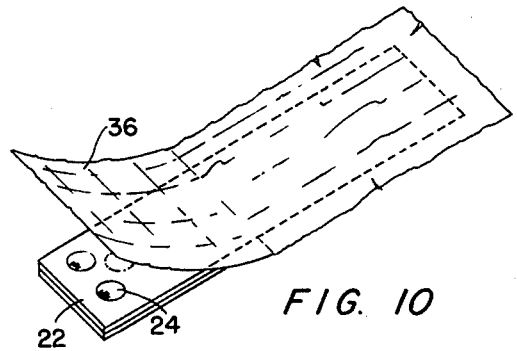
Figure 11:
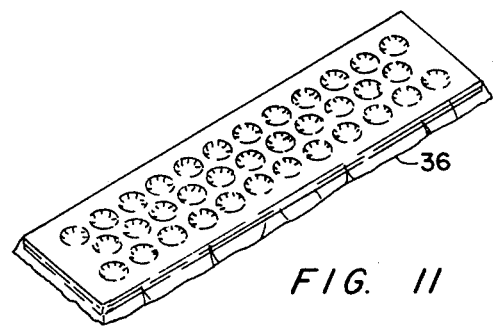
Figure 12:
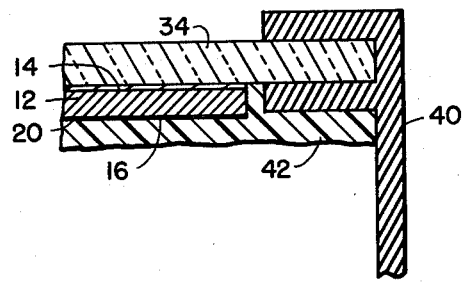
FIG. 12 is a fragmented, sectional view of the module shown in FIG. 1.
Figure 16:
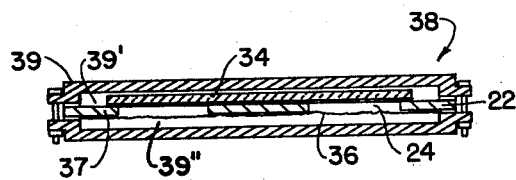
FIG. 16 is a cross sectional view of a vacuum fixture employed in the fabrication of the module.

Next, the cells 12 are vacuum bonded to the cover plate 34. To effect a vacuum bonding of the cells 12 to the cover glass a thin film 36 of substantially impervious material, such as a film of PVC, now is deposited on the surface of the tool 22, opposite the surface on which rests the cells 12, FIGS. 10 and 11, forming an assembly 37. Thereafter, the resulting assembly designated 37 is inserted into a vacuum fixture 38 and supported as shown in FIG. 16. The fixture includes an impervious cover 39 forming vacuum chamber 39' and 39", FIG. 16, adapted to be connected with separate sources of vacuum, not shown.

It should be apparent that the chamber 39' includes an hermetic seal established about the periphery of the assembly 37 whereby a vacuum may, as desired, be established between the assembly 37 and the cover 39. A vacuum now is introduced into the chambers 39' and 39", about the solar cells 12, as they are supported in the fixture 38. Then the diaphragm 36 is subjected to atmospheric pressure by venting chamber 39" while maintaining 39" under vacuum. Atmospheric pressure acting against the diaphragm 36 forces the solar cells 12 into a vacuum bonding engagement with the cover plate 34. The vacuum is held until the adhesive spreads uniformly, whereupon the assembly 37 is removed from the fixture 38 and the diaphragm 36 and tool 22 are now separated.

The cover plate 34 having the solar cells mounted thereon now is placed in a suitable structural frame member 40 and inverted preparatory to receiving on the surface of the solar cells 12 a layer 42 of transparent adhesive. The layer 42 is now permitted to cure. Upon completion of the curing process of the layer 42 of adhesive, the module 10 is ready for operation simply by making necessary circuit connections employing the leads aforementioned, but not shown.

In view of the foregoing, it should readily be apparent that the method which embodies the principles of the instant invention provides a practical and economic method readily adaptable to assembly line production techniques, whereby automation of fabrication of transparent photovoltaic modules is faciliated.

We claim:
1. In a method of fabricating a transparent photovoltaic module wherein a plurality of electrically interconnected solar cells are bonded to a rigid transparent support panel, the step of:
depositing on one face of each solar cell of a plurality of electrically interconnected solar cells a film of substantially transparent adhesive, positioning said one face of each cell in contiguous relation with a common surface of a substantially transparent support panel and simultaneously vacuum-bonding said plurality of cells to the panel.

2. A method of fabricating a photovoltaic module, including a plurality of photovoltaic cells substantially transparent to substantially all solar energy not used by the cells to produce electricity energy comprising the steps of:
A. forming a uniform, planar array of a plurality of interconnected solar cells;
B. depositing a quantity of substantially transparent adhesives on a first face of each of the cells of the plurality;
C. simultaneously vacuum-bonding the first face of each of the plurality of cells to a common, substantially transparent cover plate comprising a support panel for the module; and
D. depositing on the opposite face of each of the cells an encapsulating layer of transparent adhesive.

3. The method of claim 2 wherein the step of forming the array comprises the steps of:
positioning a plurality of uniformly dimensioned solar cells in an abutted relationship and electrically interconnecting the cells in a common circuit.

4. The method of claim 3 wherein the step of positioning the solar cells in a uniform array comprises the step of arranging the plurality of cells in a coplanar relation on a common surface of a panel having defined therein a plurality of uniformly spaced openings for affording access to the opposite faces of each of said cells of said array.

5. The method of claim 3 wherein the step of electrically interconnecting the cells in a common circuit includes the steps of electrically interconnecting the plurality of cells in circuit series.

6. The method of claim 5 wherein the first face of each solar cell of the plurality is provided with an N contact and the opposite face thereof is provided with a P contact, and the step of interconnecting the cells in a common circuit includes the step of attaching an interconnect to the N contact of one cell of the array and to the P contact of an adjacent cell of the array.

7. The method of claim 5 wherein the step of vacuum-bonding the first face of each cell of the plurality of cells to the cover plate includes the steps of:
A. placing a film in occluding relation with the circular openings;
B. placing the cover plate in supported relation with the first face of each of the cells of the plurality to form an assembly;
C. evacuating the assembly by applying vacuum to both sides of the film; and D. introducing atmospheric pressure to the film while maintaining vacuum between the film and the cover, for thus establishing a pressure differential across said film, whereby the cells are forceably pressed against said cover plate in response to applied atmospheric pressure for thus vacuum-bonding the cells to the cover plate.

8. The method of claim 7 further comprising the steps of relieving the vacuum and depositing thereon an encapsulating cover layer of transparent adhesive.

9. A method of fabricating a substantially transparent solar module comprising the steps of:
A. positioning a plurality of uniformly dimensioned photovoltaic cells of circular configurations against a plurality of alignment pins provided in a planar tool characterized by a plurality of circular cells openings disposed in uniform positional relationship with the pins for affording access to the P contact surface of each of the cells;
B. connecting to the N contact surface of alternate cells the P contact surface of the cells interposed therebetween and removing therefrom the residue of solder flux;
C. applying to the N contact surface of each cell a transparent adhesive;
D. placing a common transparent cover plate in engaged relation with the adhesive;
E. placing a diaphragm film over said cell openings; and
F. establishing a vacuum between the film and the cover plate for simultaneously forcing the cells into vacuum-bonded relation with the cover plate.

* * * * *